United States Patent [19]
Iwaya et al.

[11] Patent Number: 5,091,820
[45] Date of Patent: * Feb. 25, 1992

[54] CERAMIC PIEZOELECTRIC ELEMENT WITH ELECTRODES FORMED BY REDUCTION

[75] Inventors: Shouichi Iwaya; Munemitsu Hamada; Hitoshi Masumura, all of Tokyo, Japan

[73] Assignee: TDK Corporation, Tokyo, Japan

[*] Notice: The portion of the term of this patent subsequent to Jan. 22, 2008 has been disclaimed.

[21] Appl. No.: 431,343

[22] Filed: Nov. 3, 1989

Related U.S. Application Data

[63] Continuation-in-part of Ser. No. 27,380, Mar. 18, 1987, abandoned.

[51] Int. Cl.$^5$ .............................................. H01G 1/015
[52] U.S. Cl. ........................................ 361/304; 361/305; 361/321; 29/25.35; 427/100; 252/62.9
[58] Field of Search .................. 427/100; 252/62.9; 361/321, 304, 305; 29/25.35

[56] References Cited

U.S. PATENT DOCUMENTS

| | | | |
|---|---|---|---|
| 2,520,476 | 8/1950 | Roup et al. | 264/DIG. 57 |
| 2,838,723 | 6/1958 | Crownover | 361/305 |
| 2,841,508 | 7/1958 | Roup et al. | 501/136 |
| 3,426,250 | 2/1969 | Kahn | 361/321 |
| 4,097,911 | 6/1978 | Dorrian | 361/305 |
| 4,310,363 | 1/1982 | Engdohl | 428/629 |
| 4,663,826 | 5/1987 | Baeurle | 427/43.1 |
| 4,987,515 | 1/1991 | Iwaya et al. | 29/25.42 |

FOREIGN PATENT DOCUMENTS 1-102912 4/1989 Japan.
1-220814 9/1989 Japan.

*Primary Examiner*—Shrive Beck
*Assistant Examiner*—Benjamin L. Utech
*Attorney, Agent, or Firm*—Armstrong, Nikaido, Marmelstein, Kubovcik & Murray

[57] ABSTRACT

A ceramic piezoelectric, includes a thick core formed of a sintered ceramic material, and a pair of electrodes formed on opposing end faces of the core, wherein the electrodes are a reduced form of the ceramic material of the core. The electrodes may also be a reduced layer of an oxide formed on the ceramic material of the core.

14 Claims, 5 Drawing Sheets

CERAMIC PIEZOELECTRIC ELEMENT WITH ELECTRODES FORMED BY REDUCTION

This application is a continuation-in-part of application Ser. No. 07/027,380, filed Mar. 18, 1987, and abandoned.

BACKGROUND OF THE INVENTION

1. Field of the Invention

The present invention relates to the method of forming electrodes of piezoelectric ignition elements used in lighters or the like, capacitors, varistors, sensors, and hybrid integrated circuit (HIC) boards.

2. Description of the Prior Art

Conventionally the electrode of ceramic capacitors, piezoelectric devices and the like has been formed as shown in FIG. 2. In the figure, a cylindrical ceramic composition (a $Pb(ZrTi)O_3$ material) 10 has its upper and lower planar surfaces coated by baking with frit-contained silver electrodes (a Ag material) 11. However, this conventional ceramic composition has problems of high manufacturing cost and high product cost due to the use of silver for the electrode. In addition, electromigration specific to silver (development of dendrite silver originating from the cathode electrode when a voltage is applied across two electrodes interleaved by a relatively high hygroscopic material) which grows gradually causes ultimately the breakdown of insulation. Moreover, ceramic devices produced by the conventional method lack in durability.

SUMMARY OF THE INVENTION

The present invention is intended to overcome the foregoing prior art deficiencies, and its prime object is to provide a method of electrode formation which is inexpensive in production and free from migration. Another object of the invention is to provide a method of electrode formation which achieves the enhancement of durability of the product.

The inventive method features to include the steps of annealing or sintering ceramic composition, which has been formed and baked, in the vacuum or in a neutral or reducing atmosphere, forming a reduction layer on the ceramic surface, removing unnecessary portion of the reduction layer, and finishing the remaining reduction layers as electrodes.

DESCRIPTION OF THE PREFERRED EMBODIMENTS

Figure 1A:
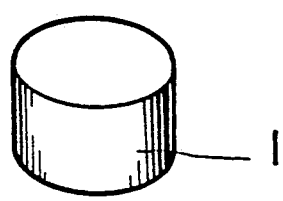
FIGS. 1(*a*), 1(*b*), 1(*c*) and 1(*d*) are perspective views of a product showing the sequential steps of the inventive method.
Figure 1B:
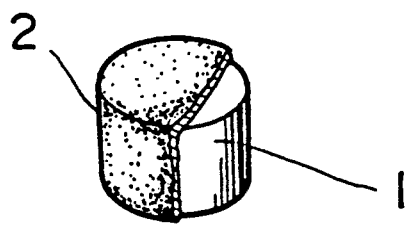
Figure 1C:
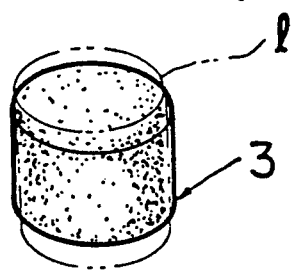
Figure 1D:
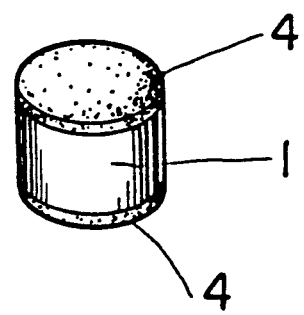
Figure 2:
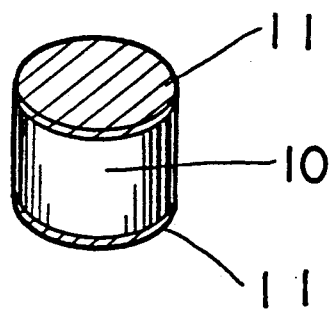
FIG. 2 is a perspective view showing the structure of a conventional lighter ignition element.

The inventive method of forming electrodes will be described with reference to FIG. 1.

Initially, a cylindrical ceramic composition (will be termed simply "ceramic") 1 is formed from a precursor powder by the conventional sequential steps of source material mixing, wet mixing, dehydration and drying, intermediate baking, grinding, particle formation, forming, and baking.

Next, the ceramic 1 is annealed in the vacuum or in a neutral or reducing atmosphere to form a reduction layer 2 on the entire surface of the ceramic 1 as shown in FIG. 1(*b*). Thereafter, unnecessary portion of the reduction layer on the column surface of the intermediate product 3 is removed as shown by the imaginary line 1 by grinding or the like, so that the top and bottom of the reduction layer are left for use as electrodes 4 as shown in FIG. 1(*d*).

In forming the reduction layer, the ceramic base is annealed in the atmosphere of hydrogen or nitrogen at a preferable temperature range from 650° to 1000° C. A lower temperature will result in a higher resistance of the reduction layer, while a higher temperature will result in an excessive formation of a reduction layer deep into the ceramic base. The optimal temperature range is from 700° to 900° C.

Products of the inventive manufacturing method include piezoelectric elements such as lighter ignition elements, capacitors, varistors, ceramic compositions for various sensors, and hybrid integrated circuit boards.

The reduction layer may otherwise be formed by forced reduction after the ceramic surface has been applied with the oxide of Zn, Pb, Bi, Sb, Yb, Sc, Y, Dy or Ta which elements are easily reduced to semiconductor by forced reduction. In this method, a plate-formed ceramic base is processed on its surface by screen printing to form a conductive pattern of the above-mentioned oxide of element, and this step is followed by forced reduction to complete a substrate.

According to the present invention, when oxide applied on the surface of said thick sintered element is reduced, a conductive layer is formed on the surface of the ceramic component.

Therefore it is useful for piezoelectric elements.

In particular, when the thick sintered element is formed from the group consisting of PZT, $PbZrO_3$ and $PbTiO_3$, a metallic layer appears on the surface of said ceramic component upon reduction. Thus, electrodes of the present invention have an advantage in that the resistance is low.

The following describes two specific embodiments of this invention.

(1) Lighter Ignition Element

A baked element of PZT material used for the lighter ignition element is baked in a reducing atmosphere in the hydrogen plus nitrogen atmosphere (20% hydrogen concentration) at 740° C. at a temperature rise/fall rate of 500° C./h to form a reduction layer with a 15 μm thickness only on the ceramic surface, and, after unnecessary portion has been ground off, remaining portions of reduction layer on the flat surfaces are finished on electrodes (this electrode will be termed "reduction electrode" hereinafter).

Figure 3:
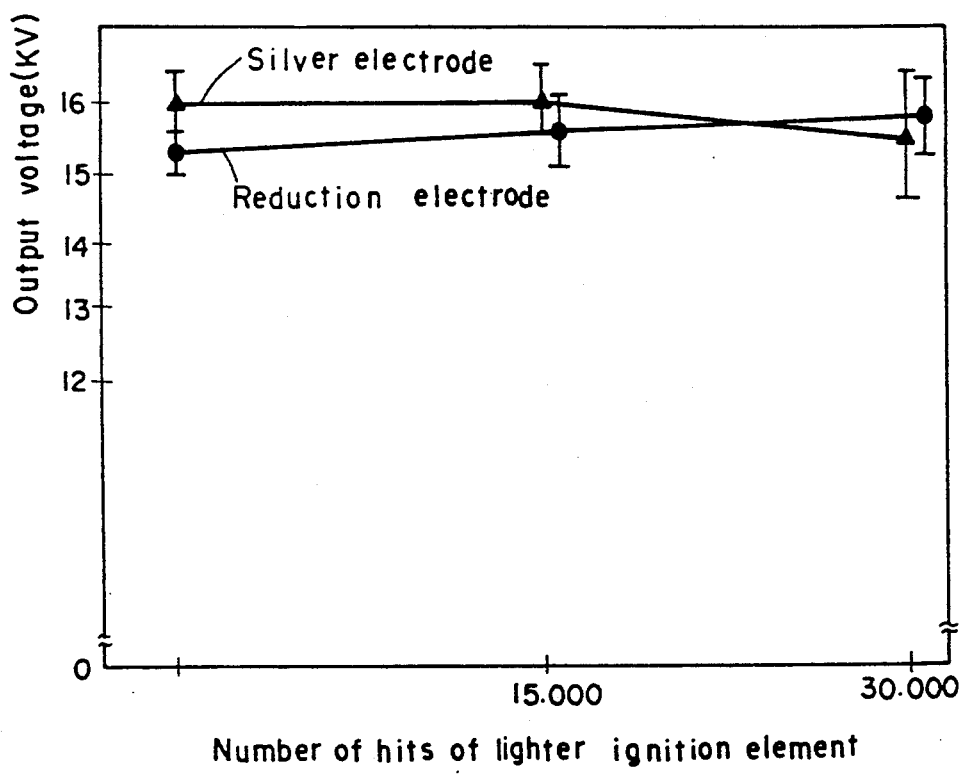
FIG. 3 is a graph of experimental data comparing the electrode characteristics achieved by the inventive method with that of the conventional electrode.
Figure 4:
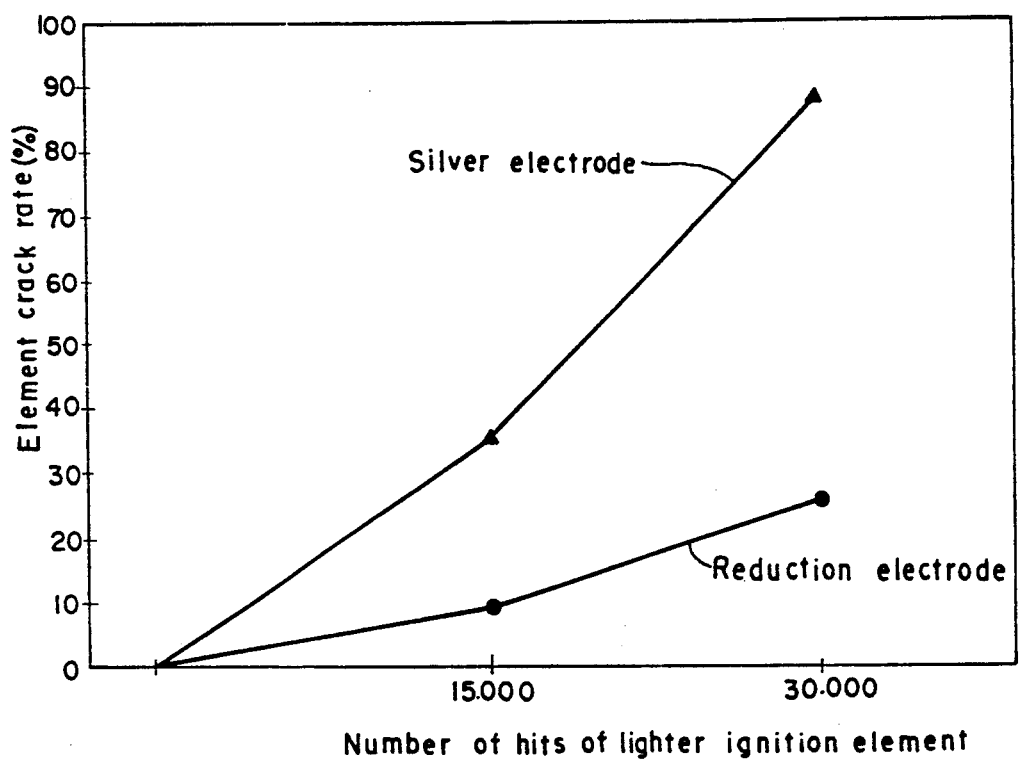
FIG. 4 is a graph of experimental data comparing the element crack rate (indicative of durability) of electrodes manufactured by the inventive method with that of the conventional electrodes.

The above ceramic was examined on the coupling characteristics (K33), with the result of 68.1% (98.7% of silver electrode) in contrast to 69.05% for the typical conventional silver electrode. The reliability and durability were also examined, the results of which are shown in FIGS. 3 and 4. The examination results indicate that the reduction electrode has characteristics comparable with the silver electrode, less characteristic decay, and enhanced durability, i.e., it is fairly eligible for the lighter ignition element. The measurement results of FIGS. 3 and 4 are all based on the same reduction condition as mentioned above, and ten samples are measured for each of the silver electrode and reduction electrode.

The graph of FIG. 3 is plotted on the vertical axis for the high-voltage output (kV) at lighter ignition action against the number of hits of the lighter ignition element on the horizontal axis. The graph indicates that the conventional silver electrode has a dull voltage output after 15,000 times of hitting, whereas the reduction electrode further gains the voltage output, proving its high durability and reliability.

The graph of FIG. 4 is plotted on the vertical axis for the percent element crack rate against the number of hits of the lighter ignition element on the horizontal axis. The graph indicates that the conventional silver electrode sharply increases in element crack rate as the number of hits grows, whereas the reduction electrode exhibits little increase, i.e., as small as 25% of elements crack after they have been hit 30,000 times. The superior durability and reliability of the reduction electrode are also proved by this test result.

(2) Capacitor

Figure 5:
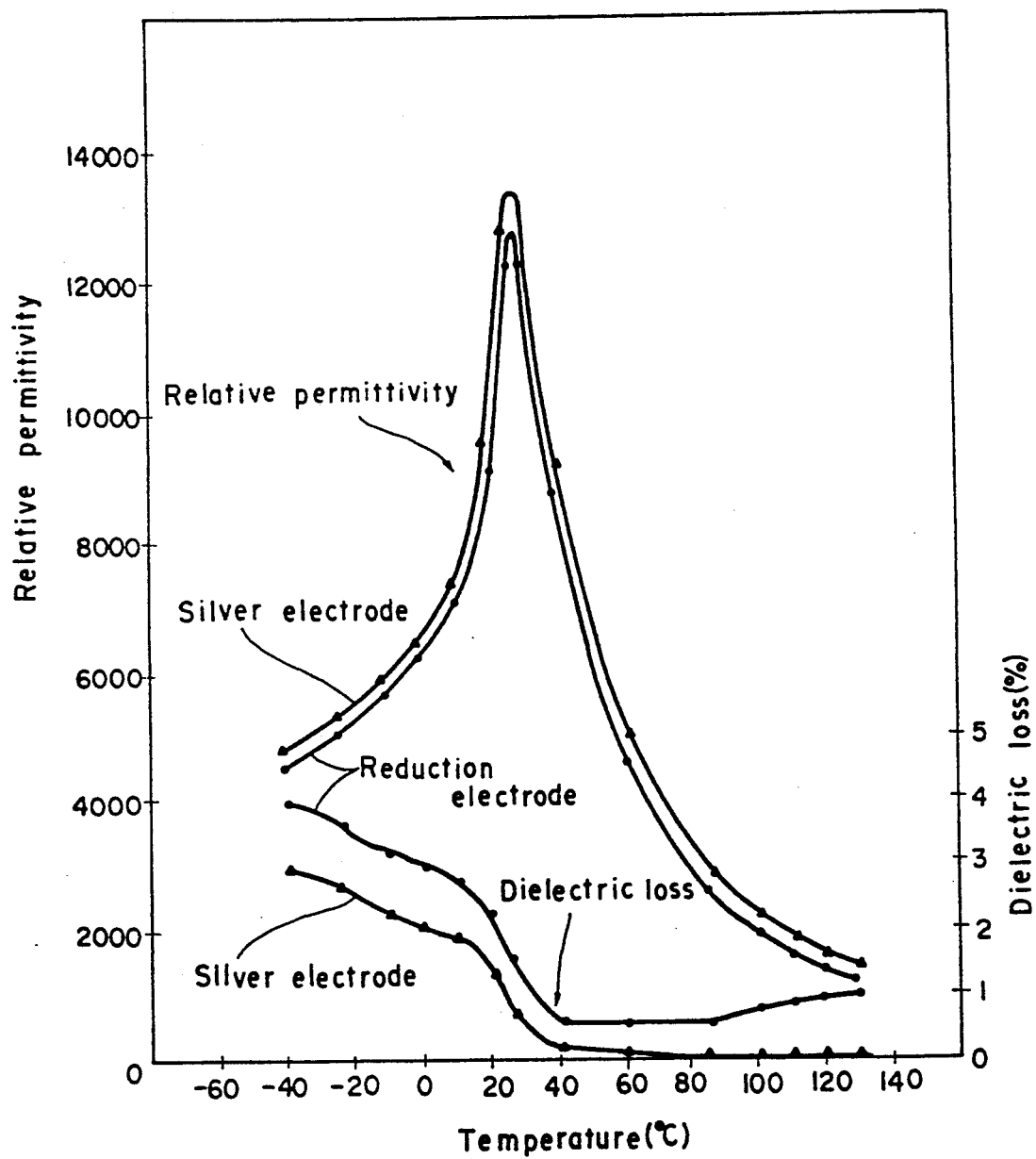
FIG. 5 is a graph of experimental data comparing the relative permittivity and dielectric loss of the electrode manufactured by the inventive method and those of the conventional electrode.

A sintered capacitor element of $BaTiO_3$ is baked in a reducing atmosphere in the hydrogen plus nitrogen atmosphere (20% hydrogen concentration) at 800° C. at a temperature rise/fall speed of 500° C./h for a settling time of 20 minutes so as to form a reduction layer only on the ceramic surface, and after the exterior unnecessary portion has been ground off the remaining planar reduction layers are finished as electrodes. The ceramic element was examined for the relative permittivity and dielectric loss, with the results shown in FIG. 5. The graph of FIG. 5 is plotted for the relative permittivity and dielectric loss (%) on two vertical axis against the temperature (° C.) on the horizontal axis. The measurement results indicate that the reduction electrode has almost the same relative permittivity as of the conventional silver electrode, and has a dielectric loss increased as little as 1% with respect to the conventional silver electrode in the normal operating temperature range (10° to 40° C.). Namely, there is no significant difference of characteristics between both types of electrodes, although the dielectric loss is slightly larger on the part of the reduction electrode, which on the other hand is small in the disparity of characteristics among elements, and the reduction electrode promises satisfactory functions as a capacitor.

As described above, the present invention enables low-cost manufacturing of ceramic elements having electrodes, which achieve electrical characteristics comparable with those of the conventional silver electrodes, and yet have enhanced durability and reduced disparity of characteristics among products.

Figure 6A:
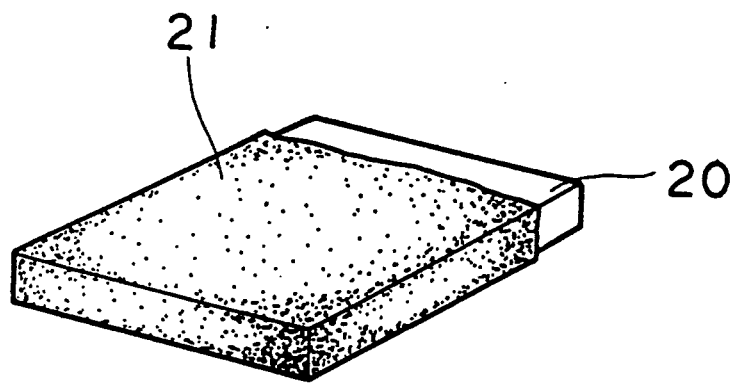
FIGS. 6(*a*) and 6(*b*) are diagrams explaining the steps of manufacturing process according to the modified embodiment of this invention.
Figure 6B:
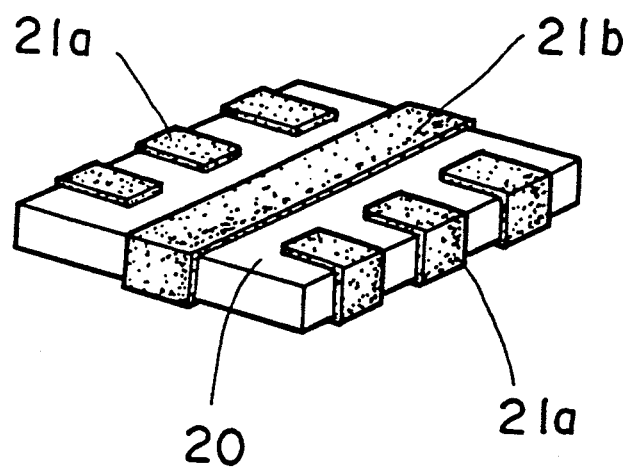

FIGS. 6(a) and 6(b) show a modified embodiment of this invention. A reduction layer 21 is formed on the entire surface of a HIC (Hybrid Integrated Circuit) board 20 as shown in FIG. 6(a), and thereafter the layer is removed by grinding or the like with pattern portions 21a and 21b being left to form electrodes as shown in FIG. 6(b). The present invention is applicable to extensive electronic component parts made up in combination of ceramics and electrodes.

We claim:

1. A ceramic piezoelectric element, comprising: a core, said core comprising first and second faces and formed of a sintered reducible ceramic material at least one electrode formed on each of said first and second faces of said core, said electrodes comprising a reduced form of said reducible ceramic material of said core.

2. A ceramic piezoelectric element, comprising: a core, said core comprising first and second faces and formed of a sintered ceramic material, at least one electrode formed on each of said first and second faces of said core, said electrodes comprising a reduced layer of an oxide, said oxide formed on the ceramic material of said core.

3. The ceramic piezoelectric element of either of claims 1 or 2, wherein said core is substantially cylindrical.

4. The ceramic piezoelectric element of one of claims 1 or 2, wherein said core is cylindrically-shaped.

5. The ceramic piezoelectric element of one of claims 1 or 2, wherein said core is plate-shaped.

6. The ceramic piezoelectric element of one of claims 1 or 2, wherein said core is disk-shaped.

7. The ceramic piezoelectric element of one of claims 1 or 2, wherein a vertical dimension of said core is greater than a vertical dimension of said at least one reduced electrode.

8. The ceramic piezoelectric element of claim 1, wherein said core is formed from one of the group consisting of PZT, $PbZrO_3$ and $PbTiO_3$.

9. The ceramic piezoelectric element of either claims 1 or 2, wherein said core is substantially enclosed by at least one of said electrodes.

10. The ceramic piezoelectric element of either claims 1 or 2 wherein a vertical dimension of at least one said electrode is greater than a vertical dimension of said core.

11. The ceramic piezoelectric element of either claims 1 or 2, wherein a vertical dimension of at least one said electrode is substantially identical to a vertical dimension of said core.

12. A ceramic piezoelectric element formed by the process of:
   a) forming a reducible ceramic core by sintering a prepared ceramic precursor;
   b) reducing at least one surface of said reducible ceramic core by performing heat treatment in a reducing atmosphere; and
   c) removing selected portions of said at least one surface, whereby at least one electrode is formed on at least one said surface of said core.

13. A ceramic piezoelectric element, comprising: a cylindrically shaped core, said core comprising first and second faces and formed of a substantially sintered reducible ceramic material, said reducible ceramic material formed from one of the group consisting of PZT, $PbZrO_3$ and $PbTiO_3$, at least one electrode formed on each of said first and second faces of said core, each said electrode comprising a reduced form of said reducible ceramic material of said core.

14. A ceramic piezoelectric element, comprising:
a cylindrically shaped core, said core comprising first and second faces and formed of a substantially sintered ceramic material, at least one electrode formed on each of said first and second faces of said core, each said electrode comprising a reduced layer of an oxide formed on said ceramic material of said core, said oxide comprising an element from the group consisting of Zn, Pb, Bi, Sb, Vb, Sc or Ta.

* * * * *

UNITED STATES PATENT AND TRADEMARK OFFICE
CERTIFICATE OF CORRECTION

PATENT NO. : 5,091,820
DATED : February 25, 1992
INVENTOR(S) : IWAYA et al

It is certified that error appears in the above-indentified patent and that said Letters Patent is hereby corrected as shown below:

On the title page: Item [30] Foreign Application Priority Data
-- June 11, 1986 [JP]   Japan    61-135249

Signed and Sealed this

Twenty-sixth Day of July, 1994

Attest:

BRUCE LEHMAN

*Attesting Officer*   *Commissioner of Patents and Trademarks*